(12) United States Patent
Coban et al.

(10) Patent No.: US 7,928,878 B1
(45) Date of Patent: Apr. 19, 2011

(54) ANALOG TO DIGITAL CONVERTER WITH LOW OUT OF BAND PEAKING

(75) Inventors: Abdulkerim L. Coban, Austin, TX (US); Alessandro Piovaccari, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 9 days.

(21) Appl. No.: 12/570,513

(22) Filed: Sep. 30, 2009

(51) Int. Cl.
*H03M 3/00* (2006.01)

(52) U.S. Cl. .................................. 341/143; 341/155

(58) Field of Classification Search ............. 341/144, 341/155, 143, 120, 118
See application file for complete search history.

(56) References Cited

U.S. PATENT DOCUMENTS

| | | | |
|---|---|---|---|
| 7,277,032 B2 * | 10/2007 | Lin | 341/131 |
| 7,365,667 B1 * | 4/2008 | Nanda et al. | 341/143 |
| 7,421,223 B2 * | 9/2008 | Jodra et al. | 399/53 |
| 7,423,567 B2 * | 9/2008 | Melanson | 341/143 |
| 7,545,232 B2 * | 6/2009 | Boos et al. | 332/145 |

OTHER PUBLICATIONS

Yaghini et al., "A 43mW CT Complex ΔΣ ADC with 23 MHz of Signal Bandwidth and 68.8dB SNDR" 2005 IEEE International Solid-State Circuits Conference. 07803-8904-2/05, 2005 IEEE.
Balmelli et al., "A 25MS/s 14b 200mW ΔΣ Modulator in 0.18 μm CMOS" 2004 IEEE International Solid =State Circuits Conference, 0-7803-8267-6/04, 2004 IEEE.
Yan et al. A Continuous-Time ΔΣ Modulator with 88dB Dynamic Range and 1.1MHz Signal Bandwidth. 2003 IEEE International Sold-State Circuits Conference, 0-7803-7707-9/03, 2003 IEEE.

* cited by examiner

*Primary Examiner* — Peguy JeanPierre
(74) *Attorney, Agent, or Firm* — Dicke, Billig & Czaja, PLLC

(57) ABSTRACT

An analog to digital converter includes a delta sigma modulator with a modified distributed feed-forward (DFF) topology. The modulator includes low pass filter circuitry that provides a first path to a first integrator and a second, feed-forward path to a second integrator that significantly reduce the out of band signal transfer function (STF) peaking of the modulator.

20 Claims, 6 Drawing Sheets

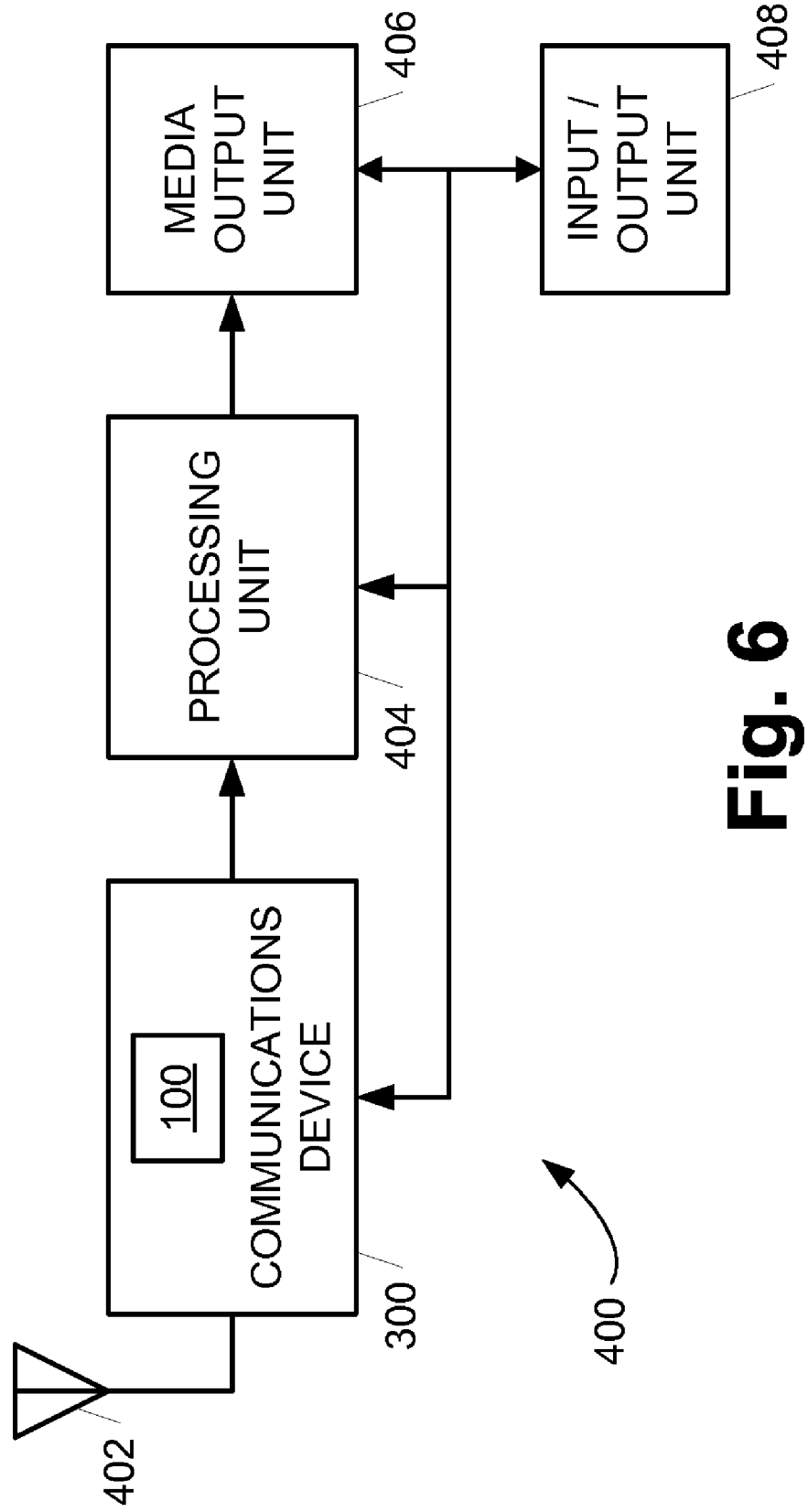

ANALOG TO DIGITAL CONVERTER WITH LOW OUT OF BAND PEAKING

BACKGROUND

Analog to digital converters (ADCs) with delta-sigma modulators may be used in signal processing chains ranging from narrow band applications (e.g., instrumentation, voice, audio, etc.) to relatively wide band applications (e.g., DSL, WiFi, TV, etc.). For high-frequency applications such as analog and digital television, low-oversampling ratio (OSR), higher order delta-sigma modulators (DSM) with multi-bit quantizers are often used.

Higher order loops in delta-sigma modulators may be realized using either distributed feed-back (DFB) or distributed feed-forward (DFF) topologies. Because of lower internal signal swings and fewer feedback digital to analog converters (DACs), DFF topologies are often chosen. Compared to DFB topologies, however, DFF topologies may result in higher out of band signal transfer function (STF) peaking. The peaking may be more pronounced in ADCs with multi-bit quantizers because more aggressive loop scaling can be done without compromising loop stability compared to delta-sigma modulators with single-bit quantizers.

Out of band STF peaking is a serious concern for applications where large close-in blockers (such as television) may be present in the vicinity of the desired channel. A baseband or intermediate frequency (IF) filter preceding the ADC may not sufficiently reduce these blockers to a level that ensures that the ADC will not become unstable. Although the maximum ADC input level may be managed to ensure that residual blockers do not overload the ADC, any reduction in the ADC input level may reduce the in-band dynamic range of the ADC.

SUMMARY

According to one exemplary embodiment, a delta sigma modulator is provided. The delta sigma modulator is configured to receive an input signal and includes low pass filter circuitry configured to generate first and second signals responsive to the input signal. The delta sigma modulator also includes an integrator configured to generate a third signal responsive to the first signal from the low pass filter circuitry and loop filter circuitry configured to generate a fourth signal responsive to the third signal from the low pass filter circuitry and the third signal from the integrator.

According to another exemplary embodiment, a communications device is provided. The communications device includes a first low pass filter configured to output a first signal in response to an input signal, a second low pass filter configured to output a second signal in response to the input signal, an integrator configured to output a third signal in response to the first signal, and loop filter circuitry configured to output a fourth signal in response to the second signal and the third signal.

According to a further exemplary embodiment, a media system is provided. The media system includes a communications device configured to receive an analog input signal and generate an output signal and a processing unit configured to generate a media signal in response to the output signal from the communications device. The communications device includes low pass filter circuitry configured to generate first and second signals responsive to the analog input signal, an integrator configured generate a third signal responsive to the first signal from the low pass filter circuitry, loop filter circuitry configured to generate a fourth signal responsive to the third signal from the low pass filter circuitry and the third signal from the integrator, analog to digital circuitry configured to generate a fifth signal responsive to the fourth signal from the loop filter circuitry and the third signal from the integrator, and processing circuitry configured to generate the output signal responsive to the fifth signal from the analog to digital circuitry.

BRIEF DESCRIPTION OF THE DRAWINGS

FIG. 6 is a block diagram illustrating one embodiment of a media system that includes a communications device.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

As described herein, an analog to digital converter includes a delta sigma modulator with a modified distributed feed-forward (DFF) topology. The modified DFF topology minimizes the out of band signal transfer function (STF) peaking of the modulator to limit the interference caused by out of band signals that are close to a desired channel. The modified DFF topology avoids sacrificing dynamic range of the modulator and allows the modulator to be implemented with lower internal signal swings and fewer digital to analog converters than a distributed feed-back (DFB) topology.

The modulator includes low pass filter circuitry that provides a first path to a first integrator and a second, feed-forward path to a second integrator. The low pass filter circuitry and the feed-forward path significantly reduce the out of band STF peaking of the modulator. The first and second integrators may be implemented using either continuous time or discrete time integrators. The low pass filter circuitry may include one or two low pass filters to form the paths to the integrators.

Figure 1A:
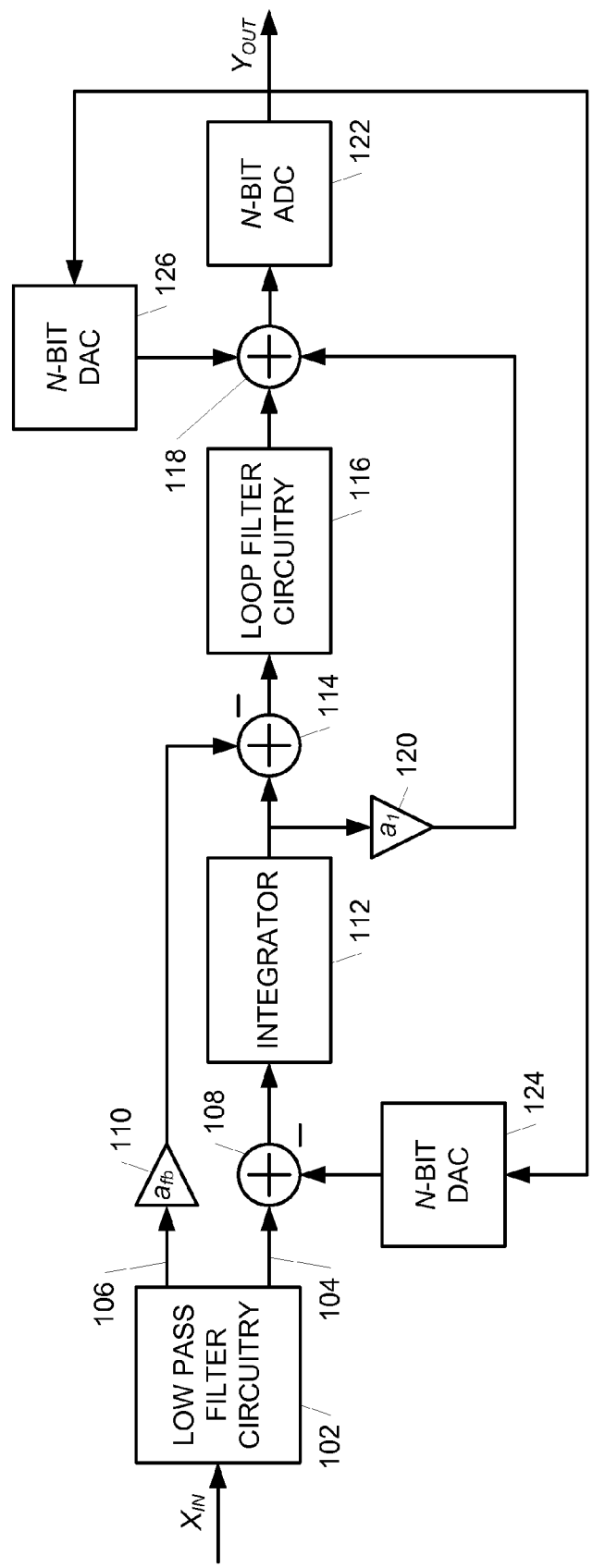
FIGS. 1A-1B are block diagrams illustrating embodiments of analog to digital converters.

FIG. 1A is a block diagram illustrating an embodiment 100A of an analog to digital converter (ADC) 100 that forms a delta-sigma modulator with a modified DFF topology. ADC 100A receives an analog input signal ($X_{IN}$) and converts the analog input signal to a digital output signal ($Y_{OUT}$). The analog input signal comprises a differential signal in one embodiment.

Figure 1B:
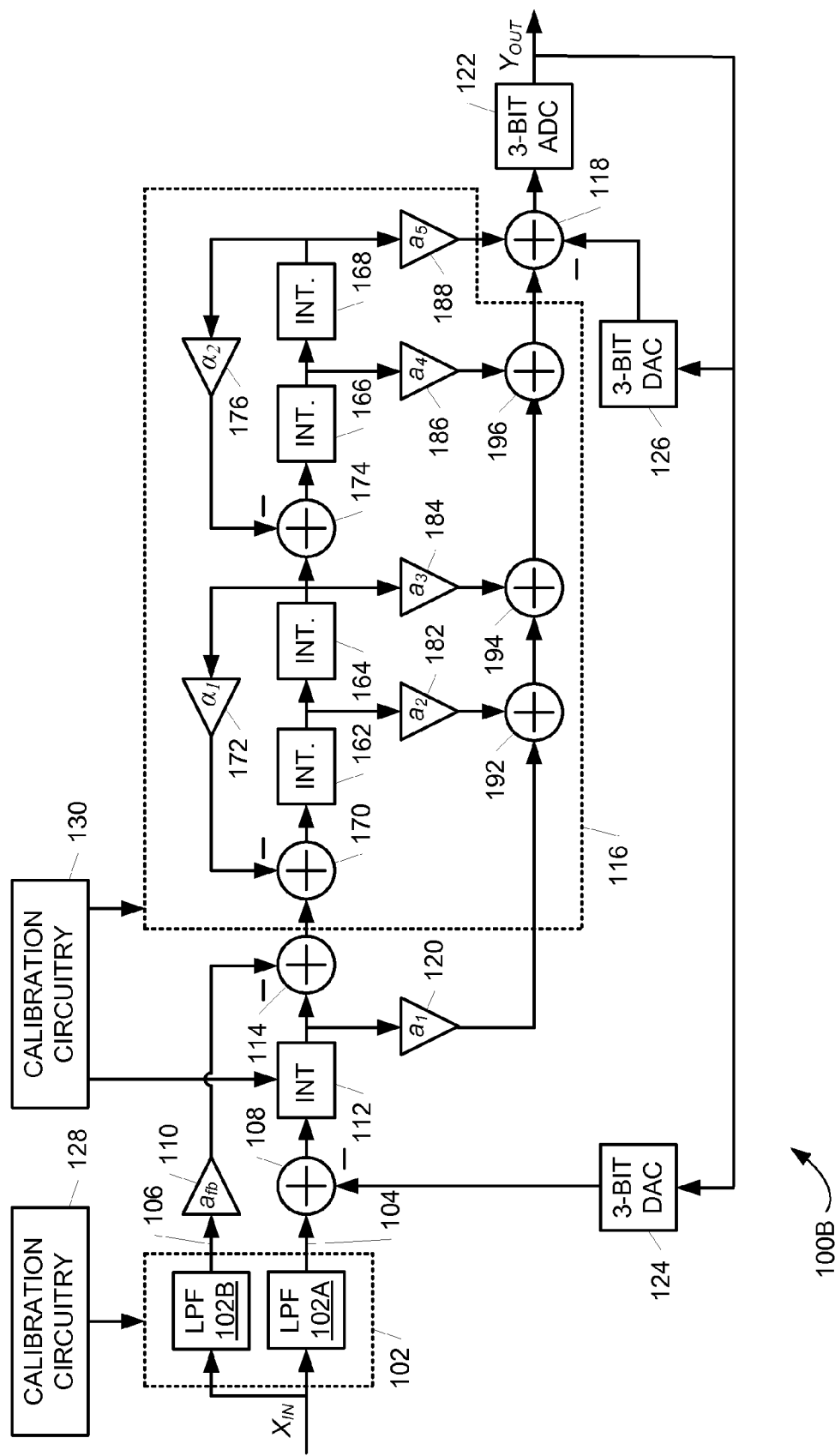
Figure 2:
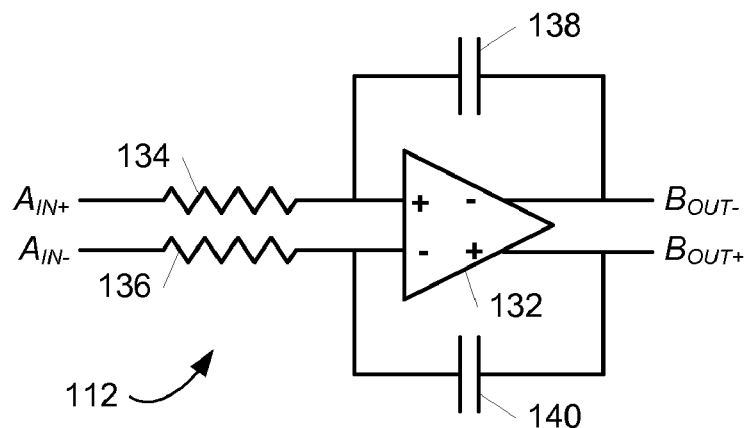
FIG. 2 is a block diagram illustrating one embodiment of an integrator.

ADC 100A includes low pass filter circuitry 102 that receives the analog input signal and low pass filters the analog input signal to generate first and second signals 104 and 106. In one embodiment, low pass filter circuitry 102 includes a first low pass filter that generates signal 104 and a second low pass filter that generates signal 106 as shown in the embodiments of FIGS. 1B and 2. In other embodiments, low pass filter circuitry 102 includes a single low pass filter that generates both signals 104 and 106.

Low pass filter circuitry 102 provides signal 104 to summation circuitry 108 which sums signal 104 with an inverted analog feedback signal from N-bit digital to analog converter (DAC) 124, where N is an integer that is greater than or equal to one, to generate a summed signal and provides the summed signal to an integrator 112. Low pass filter circuitry 102 feeds signal 106 forward by providing signal 106 to loop filter circuitry 116 through gain circuitry 110 and summation circuitry 114. Gain circuitry 110 applies a gain factor of a to signal 106 to generate a gained signal and provides the gained signal to summation circuitry 114. Integrator 112 integrates the signal from summation circuitry 108 to generate an integrated signal and provides the integrated signal to summation circuitry 114 and a feed-forward path through gain circuitry 120. Summation circuitry 114 sums an inversion of the gained signal from gain circuitry 110 with the integrated signal from integrator 112 to generate a summed signal and provides the summed signal to loop filter circuitry 116.

Loop filter circuitry 116 performs any suitable filtering function on the signal from summation circuitry 114 to generate a loop filter signal and provides the loop filter signal to summation circuitry 118. Summation circuitry 118 sums the loop filter signal with a gained signal from gain circuitry 120 to generate a summed signal and provides the summed signal to an N-bit ADC 122. Gain circuitry 120 applies a gain factor of $a_1$ to the integrated signal from integrator 112 to generate the gained signal. ADC 122 converts the analog signal from summation circuitry 118 to the digital output signal $Y_{OUT}$ and feeds back the digital output signal to N-bit DAC 124 and an N-bit DAC 126. DAC 124 converts the digital output signal to an inverted analog feedback signal and provides the inverted analog feedback signal to summation circuitry 108. DAC 126 converts the digital output signal $Y_{OUT}$ to an inverted analog feedback signal and provides the inverted analog feedback signal to summation circuitry 118. DAC 126 is used for excess loop delay compensation and may be omitted in other embodiments.

In one embodiment shown in FIG. 2, integrator 112 comprises a continuous time integrator formed from standard operational amplifier (op-amp), RC based structures. In particular, integrator 112 includes a differential op-amp 132 with a resistive element 134 connected between a non-inverting input terminal and a non-inverting differential input ($A_{IN+}$) and a resistive element 136 connected between an inverting input terminal and an inverting differential input ($A_{IN-}$). Integrator 112 also includes a capacitive element 138 connected between the non-inverting input terminal and an inverting output terminal and a capacitive element 140 connected between the inverting input terminal and a non-inverting output terminal. The inverting and non-inverting output terminals form the inverting and non-inverting differential outputs ($B_{OUT-}$ and $B_{OUT+}$), respectively. In other embodiments not shown, integrator 112 comprises a discrete time integrator such as a switched-capacitor structure and/or is formed from other suitable structures.

Integrator 112 combines with loop filter circuitry 116 to form at least a second-order loop filter. Loop filter circuitry 116 includes at least one continuous or discrete time integrator (not shown) that generates the loop filter output. The use of continuous time integrators for integrator 112 and the integrator or integrators of loop filter circuitry 116 may provide higher-speed operation and inherent anti-aliasing capability compared to discrete time integrators.

FIG. 1B is a block diagram illustrating an embodiment 100B of ADC 100 that forms a delta-sigma modulator with a modified DFF topology. ADC 100B receives an analog input signal ($X_{IN}$) and converts the analog input signal to a digital output signal ($Y_{OUT}$). The analog input signal comprises a differential signal in one embodiment.

In the embodiment of FIG. 1B, low pass filter circuitry 102 includes a low pass filter 102A and a low pass filter 102B. Low pass filter 102A low pass filters the analog input signal to generate signal 104, and low pass filter 102B low pass filters the analog input signal to generate signal 106.

Figure 3:
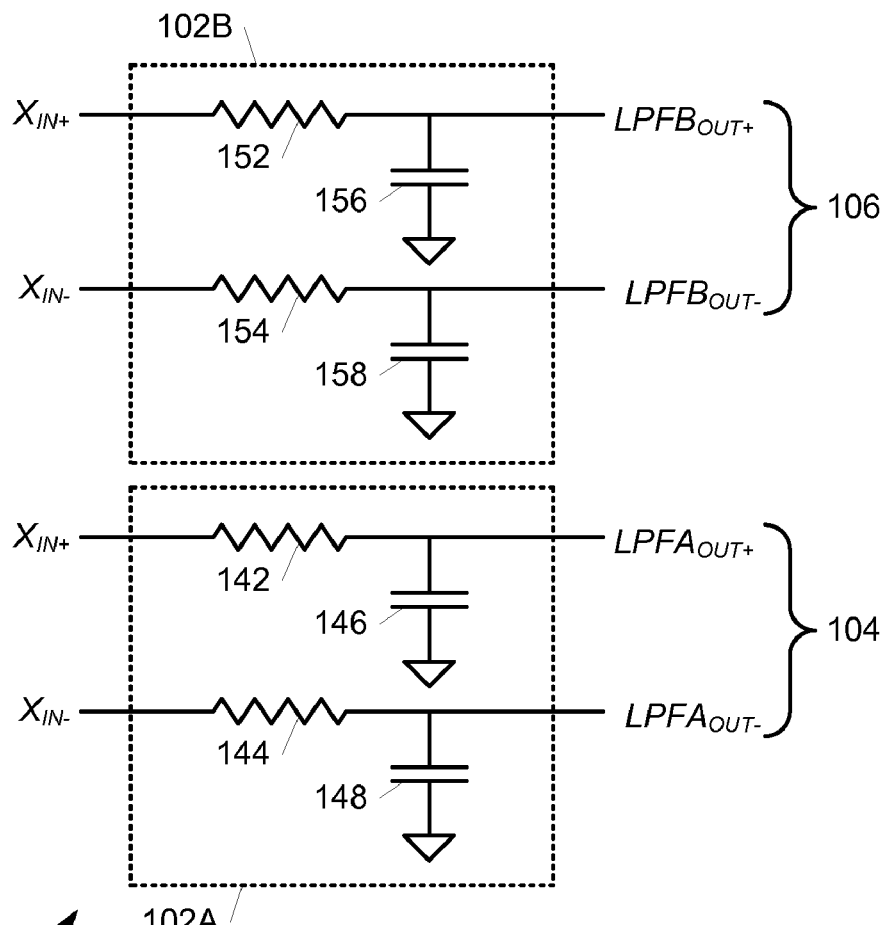
FIG. 3 is a block diagram illustrating one embodiment of low pass filter circuitry.

FIG. 3 illustrates additional details of one embodiment of low pass filters 102A and 102B. In FIG. 3, low pass filter 102A receives the differential inputs $X_{IN+}$ and $X_{IN-}$ on one end of resistive elements 142 and 144, respectively. Capacitive elements 146 and 148 are connected between the other ends of resistive elements 142 and 144, respectively, and a reference potential (e.g., ground) to form a low pass filter with differential outputs $LPFA_{OUT+}$ and $LPFA_{OUT-}$ that form signal 104. Low pass filter 102B receives the differential inputs $X_{IN+}$ and $X_{IN-}$ on one end of resistive elements 152 and 154, respectively. Capacitive elements 156 and 158 are connected between the other ends of resistive elements 152 and 154, respectively, and a reference potential (e.g., ground) to form a low pass filter with differential outputs $LPFB_{OUT+}$ and $LPFB_{OUT-}$ that form signal 106. Low pass filters 102A and 102B may be configured to have different corner frequencies.

Signal 104 is provided to summation circuitry 108 and integrator 112, and signal 106 is provided to gain circuitry 110, summation circuitry 114, and loop filter circuitry 116 as described above with reference to FIG. 1A. The gain factor $a_{fb}$ may be realized by setting resistive elements 134 and 136 (shown in FIG. 2) of an integrator 162 of loop filter circuitry 116 to different values than resistive elements 134 and 136 (shown in FIG. 2) of integrator 112. Thus, a gain of signal 104 may differ from a gain of signal 106.

Loop filter circuitry 116 includes integrators 162, 164, 166, and 168 such that the combination of integrator 112 and loop filter circuitry 116 form a fifth-order loop filter in the embodiment of FIG. 1B. Summation circuitry 170 sums the output of summation circuitry 114 with an inverted, gained feedback signal from gain circuitry 172 to generate a summed signal and provides the summed signal to integrator 162. Integrator 162 integrates the signal from summation circuitry 170 to generate an integrated signal and provides the integrated signal to integrator 164 and a feed-forward path through gain circuitry 182. Integrator 164 integrates the signal from integrator 162 to generate an integrated signal and provides the integrated signal to summation circuitry 174, a feed-forward path through gain circuitry 184, and a feedback path through gain circuitry 172. Gain circuitry 172 applies a gain of $\alpha_1$ to the integrated signal from integrator 164 to generate an inverted, gained feedback signal and provides the inverted, gained feedback signal to summation circuitry 170 along a feedback path.

Summation circuitry 174 sums the output of integrator 164 with an inverted, gained feedback signal from gain circuitry 176 to generate a summed signal and provides the summed signal to integrator 166. Integrator 166 integrates the signal from summation circuitry 174 to generate an integrated signal and provides the integrated signal to integrator 168 and a feed-forward path through gain circuitry 186. Integrator 168 integrates the signal from integrator 166 to generate an integrated signal and provides the integrated signal to a feed-forward path through gain circuitry 188 and a feedback path through gain circuitry 176. Gain circuitry 176 applies a gain of $\alpha_2$ to the integrated signal from integrator 168 to generate an inverted, gained feedback signal and provides the inverted, gained feedback signal to summation circuitry 174 along a feedback path.

Loop filter circuitry 116 also receives the gained signal from gain circuitry 120 and combines the gained signal with gained signals from integrators 162, 164, 166, and 168 along a feed-forward path formed by gain circuitries 120, 182, 184, 186, and 188 and summation circuits 192, 194, 196, and 118. Gain circuitries 182, 184, 186, and 188 apply gains of $a_2$, $a_3$, $a_4$, and $a_5$, respectively, to the integrated signals from integrators 162, 164, 166, and 168, respectively. Summation circuit 192 sums the gained signal from gain circuitry 120 with the gained signal from gain circuitry 120 to generate a summed signal. Summation circuit 194 sums the summed signal from summation circuit 192 with the gained signal from gain circuitry 184 to generate a summed signal. Summation circuit 196 sums the summed signal from summation circuit 194 with the gained signal from gain circuitry 186 to generate a summed signal. Summation circuit 118 sums the summed signal from summation circuit 196 with the gained signal from gain circuitry 188 and a feedback signal from a DAC 126 to generate a summed signal.

In the embodiment of FIG. 1B, ADC 122 comprises a 3-bit ADC, DAC 124 comprises a 3-bit DAC, and DAC 126 comprises a 3-bit DAC with a gain that differs from the gain of DAC 124. ADC 122 converts the summed analog signal from summation circuitry 118 to the digital output signal $Y_{OUT}$ and feeds back the digital output signal to DAC 126 and DAC 124. DAC 126 converts the digital output signal to an inverted analog feedback signal and provides the inverted analog feedback signal to summation circuitry 118. DAC 124 converts the digital output signal to an inverted analog feedback signal and provides the inverted analog feedback signal to summation circuitry 108. In other embodiments, DAC 126 and the feedback path from ADC 122 to summation circuitry 118 through DAC 126 may be omitted.

ADC 100B also includes calibration circuitries 128 and 130. Calibration circuitry 128 is configured to set the resistor capacitor (RC) time constants of low pass filter circuitries 102A and 102B by adjusting capacitors 146, 148, 156, and 158 (shown in FIG. 3). In one embodiment, capacitors 146, 148, 156, and 158 each represent a digitally tunable, binary weighted capacitor bank that is adjustable by calibration circuitry 128. In other embodiments, capacitors 146, 148, 156, and 158 each represent other suitable adjustable capacitor structures. Calibration circuitry 128 adjusts capacitors 146, 148, 156, and 158 to accurately set the corner frequencies of low pass filter circuitries 102A and 102B. Calibration circuitry 128 is located on chip with ADC 100B.

Calibration circuitry 130 is configured to set the RC time constants of integrator 112 and loop filter circuitry 116 by adjusting capacitors 138 and 140 (shown in FIG. 2) in each integrator 112, 162, 164, 166, and 168 in ADC 100B. In one embodiment, each capacitor 138 and 140 in each integrator 112, 162, 164, 166, and 168 represents a digitally tunable, binary weighted capacitor bank that is adjustable by calibration circuitry 130. In other embodiments, each capacitor 138 and 140 in each integrator 112, 162, 164, 166, and 168 represents other suitable adjustable capacitor structures. Calibration circuitry 130 adjusts capacitors 138 and 140 in each integrator 112, 162, 164, 166, and 168 to accurately set the corner frequencies of integrators 112, 162, 164, 166, and 168. Calibration circuitry 130 is located on chip with ADC 100B and operates independently of calibration circuitry 128.

Calibration circuitries 128 and 130 may be configured to operate independently of one another to provide flexibility in controlling the signal transfer function behavior of ADC 100B.

Figure 4:
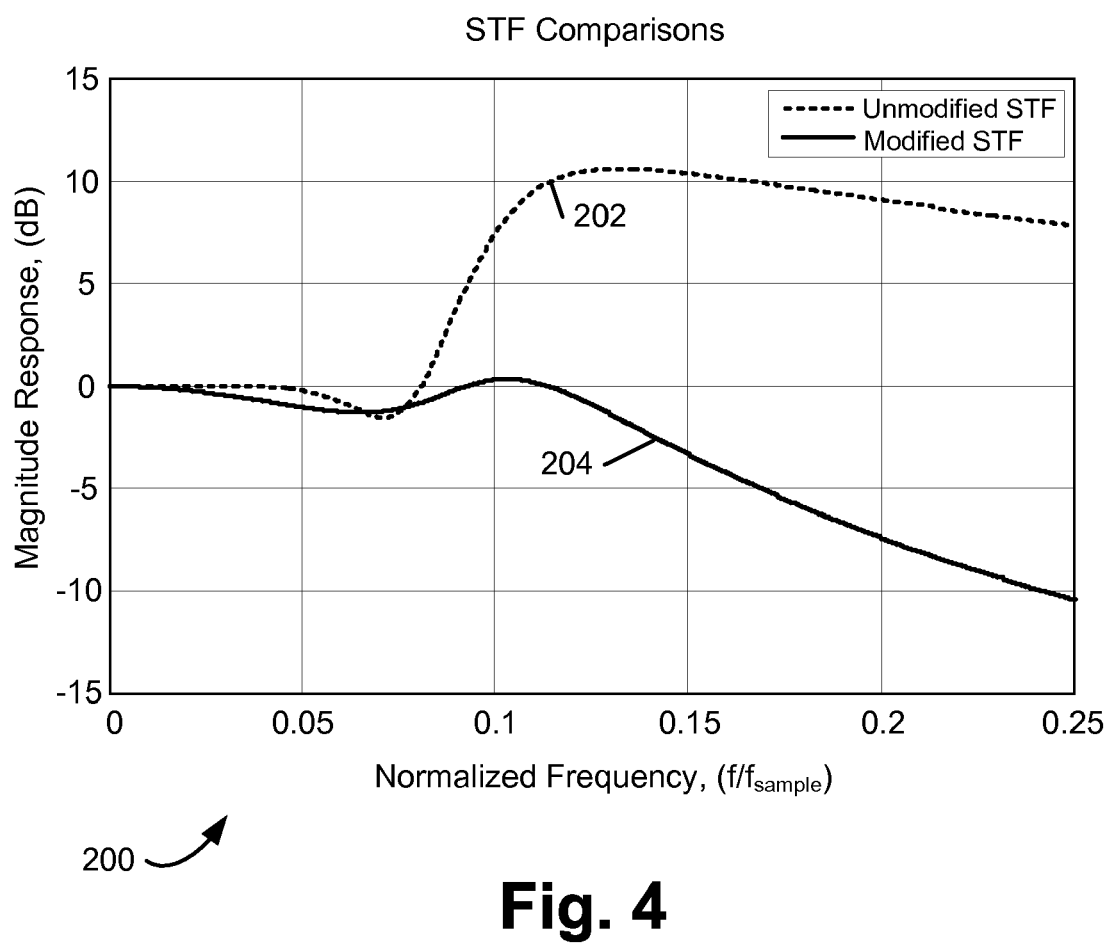
FIG. 4 is a graphical diagram illustrating one embodiment of signal transfer functions for different analog to digital converters.

FIG. 4 is a graphical diagram 200 illustrating one embodiment of signal transfer functions (STFs) 202 and 204 for different analog to digital converters. STF 202 illustrates a representative unmodified DFF ADC topology, and STF 204 illustrates a representative modified DFF ADC topology as shown in the embodiments of ADC 100 in FIGS. 1A and 1B. As shown in FIG. 4, the modified DFF ADC topology has significantly less out of band signal peaking (e.g., more than 10 dB difference) than the unmodified DFF ADC topology with the same noise transfer function. The in-band frequency of the modified DFF ADC topology spans from 0 to approximately 0.04 times the normalized frequency and the in-band signal droop is less than 1 dB. The use of low pass filter circuitry 102 also ensures that the magnitude of the modified DFF ADC topology STF does not exceed the in-band level. As a result, the maximum ADC dynamic range may be utilized by modified DFF ADC topology.

As illustrated by FIG. 4, ADC 100 may potentially operate with no out of band peaking and may, therefore, be more immune to out of band interferers without sacrificing the dynamic range of ADC 100. Low pass filter circuitry 102 and the feed-forward path between low pass filter circuitry 102 and a second integrator (e.g., integrator 162 in FIG. 1B) may operate to effectively eliminate the out of band STF peaking.

Figure 5:
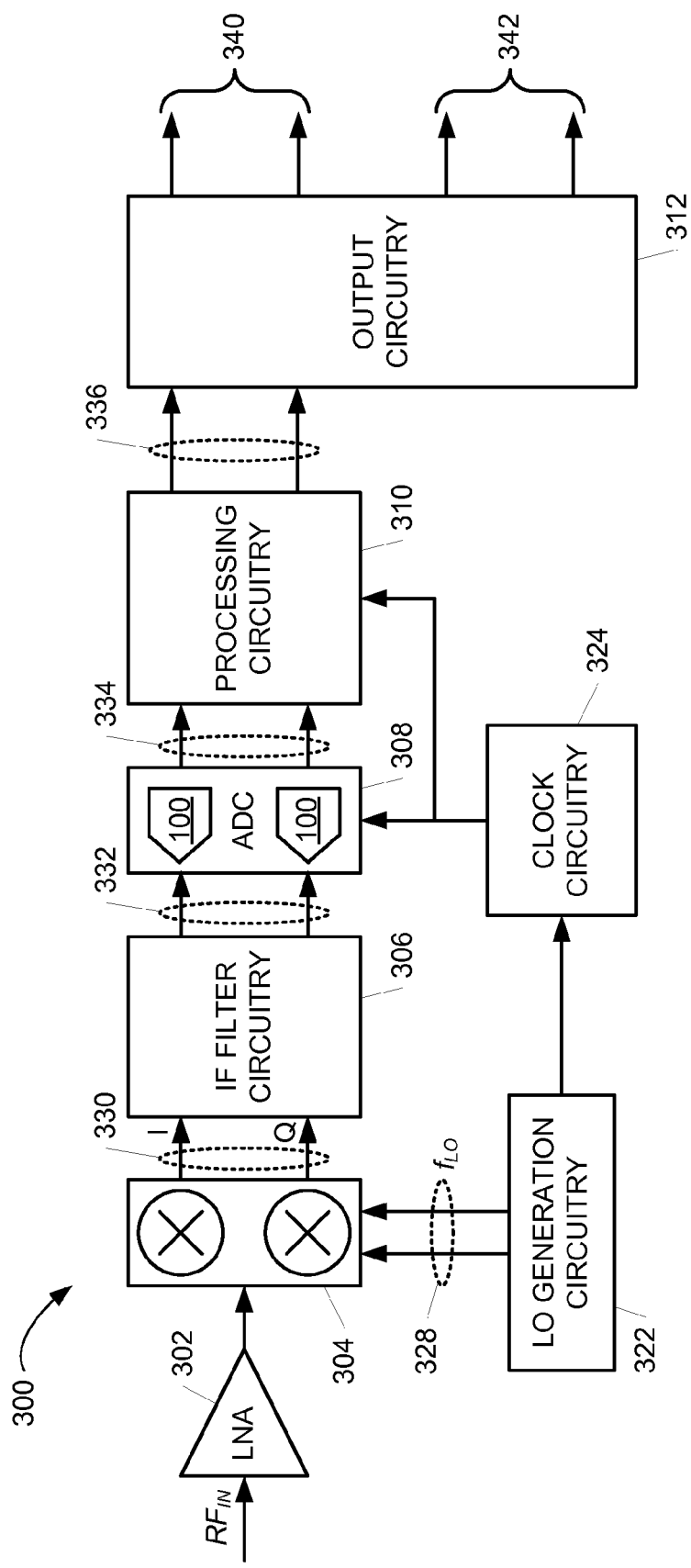
FIG. 5 is a block diagram illustrating one embodiment of selected portions of a communications device.

ADC 100 may be used with respect to a wide variety of communications systems. In one embodiment, ADC 100 may be configured as a continuous time delta-sigma modulator with a modified DFF loop filter for use in intermediate frequency applications as shown in FIG. 5. In this embodiment, ADC 100 may be configured to operate with a 200 MHz reference signal, a channel bandwidth of 8 MHz, and a low oversampling ratio (OSR) of 12.5×. In addition, ADC 100 may be configured to meet or exceed ATSC/QAM, DVB-T/C, DVB-T2/C2, DVB-S/S2, ISDB-T/C, NTSC, PAL, and/or SECAM specifications.

FIG. 5 is a block diagram illustrating one embodiment of selected portions of a low intermediate frequency (low-IF) receiver 300 with ADCs 100. Receiver 300 includes a low noise amplifier (LNA) 302, a mixer 304, low intermediate frequency (IF) filter circuitry 306, ADC circuitry 308 with ADCs 100, processing circuitry 310, output circuitry 312, local oscillator generation circuitry 322, and clock circuitry 324.

Receiver 300 is configured to receive a radio-frequency (RF) signal ($RF_{IN}$) and process the RF signal to generate a digital audio and/or video media output 340 and/or an analog audio and/or video media output 342. Receiver 300 forms an integrated terrestrial or cable broadcast receiver configured to receive RF signals. As used herein, an RF signal means an electrical signal conveying useful information and having a frequency from about 3 kilohertz (kHz) to thousands of gigahertz (GHz), regardless of the medium through which the signal is conveyed. Thus, an RF signal may be transmitted through air, free space, coaxial cable, and/or fiber optic cable, for example. Accordingly, receiver 300 may receive the RF signal from a wired or wireless medium. In other embodiments, receiver 300 may be configured to receive signals in another suitable frequency range.

LNA 302 receives the RF signal and generates an amplified output signal. The output of LNA 102 is then applied to mixer 304, and mixer 304 generates real (I) and imaginary (Q) output signals, as represented by signals 330. To generate low-IF signals 330, mixer 304 uses phase shifted local oscillator (LO) mixing signals 328. LO generation circuitry 322 includes oscillation circuitry (not shown) and outputs two out-of-phase LO mixing signals 328 that are used by mixer 304. The outputs of mixer 304 are at a low-IF which may be fixed or designed to vary, for example, if discrete step tuning is used for LO generation circuitry 322. LO generation circuitry 322 also provides a reference signal to clock circuitry 324. Clock circuitry 324 generates a clock signal from the reference signal and provides the clock signal ADC circuitry 308 and processing circuitry 310.

Low-IF filter circuitry 306 receives the real (I) and imaginary (Q) signals 330 and outputs real and imaginary digital signals, as represented by signals 332. Low-IF filter circuitry 306 provides, in part, signal gain and signal filtering functions. Mixer 304 mixes the target channel within the input signal spectrum down to an IF that is equal to or below about three channel widths. For spectrums with non-uniform channel spacings, a low IF frequency may be equal to or below about three steps in the channel tuning resolution of the receiver circuitry. For example, if the receiver circuitry were configured to tune channels that are at least about 100 kHz apart, a low IF frequency would be equal to or below about 300 kHz. The IF frequency may be fixed at a particular frequency or may vary within a low-IF ranges of frequencies, depending upon the LO generation circuitry utilized and how it is controlled. Low-IF filter circuitry 306 provides signals 332 to ADC circuitry 308.

ADC circuitry 308 includes an ADC 100 for the real (I) signal and an ADC 100 for the imaginary (Q) signal. ADCs 100 convert the real (I) and imaginary (Q) signals to the digital domain and provides digital real (I) and imaginary (Q) signals 334 to processing circuitry 310.

Processing circuitry 310 performs digital filtering and digital signal processing to further tune and extract the signal information from digital signals 334. Processing circuitry 310 produces baseband digital media signals 336. When the input signals relate to analog television broadcasts, the digital processing provided by processing circuitry 310 may include, for example, analog television demodulation. Processing circuitry 310 provides baseband digital media signals 336 to output circuitry 312.

Output circuitry 312 outputs baseband digital media signals 336 as digital media output signals 340 in any suitable digital format such as an IF I/Q format (e.g., low-IF (LIF) or zero-IF (ZIF) I/Q). Output circuitry 312 may also convert the digital baseband digital media signals 336 into analog media output signals 342 in any suitable analog format such as composite video baseband signal (CVBS) and/or sound IF/audio frequency (SIF/AF).

FIG. 6 is a block diagram illustrating one embodiment of a media system 400 that includes communications device 300 with ADCs 100 as shown in FIG. 5. Media system 400 may be any type of portable or non-portable system configured to provide a media output such as a mobile or cellular telephone, a personal digital assistant (PDA), an audio and/or video player (e.g., an MP3 or DVD player), and a notebook or laptop computer.

Media system 400 includes communications device 300 that receives a media transmission from an antenna 402 or other suitable input and provides a digital and/or analog media signal to a processing unit 404. Processing unit 404 performs any suitable processing on the media signal (e.g., television demodulation on a digital baseband signal) and provides the processed signal to a media output unit 406 for output to a user. Processing unit 404 may be omitted in some embodiments such that the media signal from communications device 300 may be provided directly to media output unit 406 in these embodiments. Media output unit 406 may include any suitable type and/or combination of audio and/or video output devices such as a television, a monitor, a display screen, a speaker, or headphones.

An input/output unit 408 receives inputs from a user and provides the inputs to communications device 300, processing unit 404, and/or media output device 406. Input/output unit 408 also receives outputs from communications device 300, processing unit 404, and/or media output device 406 and provides the outputs to a user. The inputs and outputs may include voice and/or data communications, audio, video, image, and/or other graphical information. Input/output unit 408 includes any number and types of input and/or output devices to allow a user provide inputs to and receive outputs from media system 400. Examples of input and output devices include a microphone, a speaker, a keypad, a pointing or selecting device, and a display device.

In the above embodiments, a variety of circuit and process technologies and materials may be used to implement the circuitries, devices, and systems. Examples of such technologies include metal oxide semiconductor (MOS), p-type MOS (PMOS), n-type MOS (NMOS), complementary MOS (CMOS), silicon-germanium (SiGe), gallium-arsenide (GaAs), silicon-on-insulator (SOI), bipolar junction transistors (BJTs), and a combination of BJTs and CMOS (BiCMOS).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A delta sigma modulator configured to receive an input signal, the delta sigma modulator comprising:
    low pass filter circuitry configured to generate first and second signals responsive to the input signal;
    an integrator configured to generate a third signal responsive to the first signal from the low pass filter circuitry; and
    loop filter circuitry configured to generate a fourth signal responsive to the second signal from the low pass filter circuitry and the third signal from the integrator.

2. The delta sigma modulator of claim 1, further comprising:
    analog to digital circuitry configured to generate an output signal responsive to the fourth signal from the loop filter circuitry and the third signal from the integrator.

3. The delta sigma modulator of claim 2, further comprising:
    first digital to analog circuitry configured to generate a fifth signal responsive to the output signal from the analog to digital circuitry;
    wherein the integrator is configured to generate the third signal responsive to the first signal from the low pass filter circuitry and the fifth signal from the first digital to analog circuitry.

4. The delta sigma modulator of claim 3, further comprising:
- second digital to analog circuitry configured to generate a sixth signal;
- wherein the analog to digital circuitry is configured to generate the output signal responsive to the fourth signal from the loop filter circuitry and the sixth signal from the second digital to analog circuitry.

5. The delta sigma modulator of claim 1 wherein the low pass filter circuitry includes a first low pass filter configured to generate the first signal responsive to the input signal and a second low pass filter configured to generate the second signal responsive to the input signal, and wherein a first corner frequency of the first low pass filter differs from a second corner frequency of the second low pass filter.

6. The delta sigma modulator of claim 1 wherein a first gain of the first signal differs from a second gain of the second signal.

7. The delta sigma modulator of claim 1 wherein the integrator and the loop filter comprise a plurality of continuous time integrators.

8. The delta sigma modulator of claim 1 wherein the integrator and the loop filter comprise a plurality of discrete time integrators.

9. The delta sigma modulator of claim 1 further comprising:
- calibration circuitry configured to set an RC time constant of the low pass filter circuitry.

10. The delta sigma modulator of claim 1 further comprising:
- calibration circuitry configured to set a first RC time constant of the integrator and a second RC time constant of the loop filter circuitry.

11. A communications device comprising:
- a first low pass filter configured to output a first signal in response to an input signal;
- a second low pass filter configured to output a second signal in response to the input signal;
- an integrator configured to output a third signal in response to the first signal; and
- loop filter circuitry configured to output a fourth signal in response to the second signal and the third signal.

12. The communications device of claim 11 wherein the integrator is configured to output the third signal in response to the first signal and the fourth signal.

13. The communications device of claim 12 further comprising:
- analog to digital circuitry configured to convert the fourth signal to a digital signal; and
- digital to analog circuitry configured to convert the digital signal to an analog signal and provide the analog signal to the integrator.

14. The communications device of claim 11 wherein a first corner frequency of the first low pass filter differs from a second corner frequency of the second low pass filter.

15. The communications device of claim 11 wherein a first gain of the first signal differs from a second gain of the second signal.

16. A media system comprising:
- a communications device configured to receive an analog input signal and generate an output signal, the communications device includes:
  - low pass filter circuitry configured to generate first and second signals responsive to the analog input signal;
  - an integrator configured generate a third signal responsive to the first signal from the low pass filter circuitry;
  - loop filter circuitry configured to generate a fourth signal responsive to the third signal from the low pass filter circuitry and the third signal from the integrator;
  - analog to digital circuitry configured to generate a fifth signal responsive to the fourth signal from the loop filter circuitry and the third signal from the integrator; and
  - processing circuitry configured to generate the output signal responsive to the fifth signal from the analog to digital circuitry;
- a processing unit configured to generate a media signal in response to the output signal from the communications device.

17. The media system of claim 16 further comprising:
- a media output device configured to generate a media output in response to the media signal from the processing circuitry.

18. The media system of claim 17 further comprising:
- an input/output unit configured to provide a control signal to the media output device.

19. The media system of claim 16 wherein the low pass filter circuitry includes a first low pass filter configured to generate the first signal responsive to the input signal and a second low pass filter configured to generate the second signal responsive to the input signal, and wherein a first corner frequency of the first low pass filter differs from a second corner frequency of the second low pass filter.

20. The media system of claim 16 wherein a first gain of the first signal differs from a second gain of the second signal.

* * * * *